US007011143B2

(12) United States Patent
Corrado et al.

(10) Patent No.: US 7,011,143 B2
(45) Date of Patent: Mar. 14, 2006

(54) METHOD AND APPARATUS FOR COOLING ELECTRONIC COMPONENTS

(75) Inventors: Joseph P. Corrado, Marlboro, NY (US); John F. Eberth, Verbank, NY (US); Steven J. Mazzuca, New Paltz, NY (US); Roger R. Schmidt, Poughkeepsie, NY (US); Takeshi Tsukamoto, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 10/838,669

(22) Filed: May 4, 2004

(65) Prior Publication Data

US 2005/0247433 A1    Nov. 10, 2005

(51) Int. Cl.
*F28F 7/00* (2006.01)

(52) U.S. Cl. ............... 165/80.4; 165/292; 165/104.33; 361/698; 361/702

(58) Field of Classification Search ............. 165/80.4, 165/104.33, 104.34, 122, 48.1, 279, 292; 361/683, 691, 698–702, 715–716, 728–730; 62/259.2, 259.4; 257/714, 716
See application file for complete search history.

(56) References Cited

U.S. PATENT DOCUMENTS

| | | | | |
|---|---|---|---|---|
| 3,481,393 A | * | 12/1969 | Chu ......................... | 165/80.4 |
| 3,749,981 A | * | 7/1973 | Koltuniak et al. .......... | 361/696 |
| 4,072,188 A | * | 2/1978 | Wilson et al. ............. | 165/80.4 |
| 5,144,531 A | * | 9/1992 | Go et al. ..................... | 361/702 |
| 5,370,178 A | | 12/1994 | Agonafer et al. ........... | 165/137 |
| 5,406,807 A | * | 4/1995 | Ashiwake et al. ............ | 62/376 |
| 5,482,113 A | | 1/1996 | Agonafer et al. ........... | 165/137 |
| 5,509,468 A | * | 4/1996 | Lopez ........................ | 165/144 |
| 5,740,018 A | * | 4/1998 | Rumbut, Jr. ................ | 361/720 |
| 6,313,990 B1 | | 11/2001 | Cheon ........................ | 361/699 |
| 6,462,949 B1 | | 10/2002 | Parish, IV et al. .......... | 361/699 |
| 6,765,795 B1 | * | 7/2004 | Modica ....................... | 361/695 |
| 2004/0221604 A1 | * | 11/2004 | Ota et al. ................... | 62/259.2 |

* cited by examiner

*Primary Examiner*—Tho Duong
(74) *Attorney, Agent, or Firm*—Lily Neff; Cantor Colburn LLP

(57) ABSTRACT

A modular fluid unit for cooling heat sources located on a rack, the modular fluid unit comprising: a heat exchanger in fluid communication a pump; and wherein the modular fluid unit is mountable within the rack and is configurable to be in fluid communication with a cold plate return manifold, a cold plate supply manifold, and an end-user fluid supply. A method for cooling electronic components in a rack, the method comprising: circulating a first liquid from a cold plate to one of a plurality of heat exchangers mounted within the rack; circulating a second liquid from a second liquid supply to the one of a plurality of heat exchangers; and transferring heat from the first liquid to the second liquid at the one of a plurality of heat exchangers.

18 Claims, 6 Drawing Sheets

METHOD AND APPARATUS FOR COOLING ELECTRONIC COMPONENTS

BACKGROUND OF THE INVENTION

The presently disclosed method and apparatus are generally directed to a cooling unit for the cooling of electronic components. More particularly, the disclosed method and apparatus are directed to a modular fluid cooling unit.

One of the possibilities for cooling electronic components is the employment of arrays of air cooled heat sinks. Heat generated in an electronic component is conducted into the heat sinks and dissipated through the passage of a forced flow of ambient air within high aspect ratio flow channels between the heat sinks. Data centers with large computer and electronic systems vary greatly in airflow, raised floor height, chilled air availability and floor space. As a result, sometimes it is difficult to arrange air cooled machines in patterns that will allow for effective cooling. Each data center must be designed specifically to that data center's environmental conditions. In many cases, the machines must be spread out in order to prevent hot air recirculation. Other problems include impractical under-floor air flow rates, harsh environmental conditions, air conditioning power requirements, and the footprint of massive chillers. In future machines, as power levels per module increase, the combined heat dissipated by many machines in a confined workspace, whether they are independent or part of a large local area network (LAN), could exceed the capacity of the room air conditioning system in which the systems are placed. Refrigeration is an expensive alternative, but can also have similar problems.

The forgoing, in combination with current widespread trends in customer expectations for cooling computing systems which include: (1) redundancy, (2) versatility in installation and operating environment, (3) system expandability, (4) maintenance and system modifications performed without loss of system availability, and (5) reduction in the price per unit of computing capacity; creates a relatively untenable landscape and therefore the art is in need of improved cooling systems capable of resolving the need issues.

SUMMARY OF THE INVENTION

The disclosed apparatus relates to a modular fluid unit for cooling heat sources located on a rack, the modular fluid unit comprising: a heat exchanger in fluid communication a pump; and wherein the modular fluid unit is mountable within the rack and is configurable to be in fluid communication with a cold plate return manifold, a cold plate supply manifold, and an end-user fluid supply.

The disclosed system relates to cooling heat sources, the system comprising: a rack for holding electronic components; a cold plate located adjacent to a heat source located on the electronic components; a cold pate supply manifold in fluid communication with the cold plate; a cold plate return manifold in fluid communication with the cold plate; and a modular fluid unit mounted within the rack in fluid communication with the cold plate supply manifold, the cold plate return manifold and an end-user fluid supply.

Another embodiment of the disclosed system relates to cooling heat sources, the system comprising: a first rack for holding a modular fluid unit; a second rack for holding electronic components; a cold plate located adjacent to a heat source on the second rack; a cold pate supply manifold in fluid communication with the first cold plate; a cold plate return manifold in fluid communication with the first cold plate; and wherein the modular fluid unit mounted within the first rack is in fluid communication with the cold plate supply manifold, the cold plate return manifold, and an end-user fluid supply.

A further embodiment of the disclosed system relates to cooling heat sources, the system comprising: a rack for holding electronic components; an air fin and tube heat exchanger located adjacent to a heat source located on the electronic components; a supply manifold in fluid communication with the air fin and tube heat exchanger; a return manifold in fluid communication with the air fin and tube heat exchanger; a modular fluid unit mounted within the rack in fluid communication with the supply manifold, the return manifold and an end-user fluid supply.

The disclosed method relates to cooling electronic components in a rack, the method comprising: circulating a first liquid from a cold plate to one of a plurality of heat exchangers mounted within the rack; circulating a second liquid from a second liquid supply to the one of a plurality of heat exchangers; and transferring heat from the first liquid to the second liquid at the one of a plurality of heat exchangers.

BRIEF DESCRIPTION OF THE DRAWINGS

Referring to the exemplary drawings wherein like elements are numbered alike in the several Figures:

FIG. 3 is a perspective view of the disclosed apparatus with covers on;

DETAILED DESCRIPTION

Disclosed herein is a liquid cooling mechanism for electronic and/or computer systems using fluid from a central supply. Embodiments hereof are configured as a modular cooling apparatus that can be easily installed and removed from a rack. Further, the disclosed modular cooling apparatus is stackable (either vertically or horizontally), i.e. it can be placed in a redundant configuration with another modular cooling apparatus. In such a redundant configuration, one of the modular cooling apparatuses can be shut down, while the other modular cooling apparatus remains in operation. This allows for the servicing or replacing of one of the cooling apparatuses, without the necessity of shutting down the electronic and/or computer system.

Figure 1:
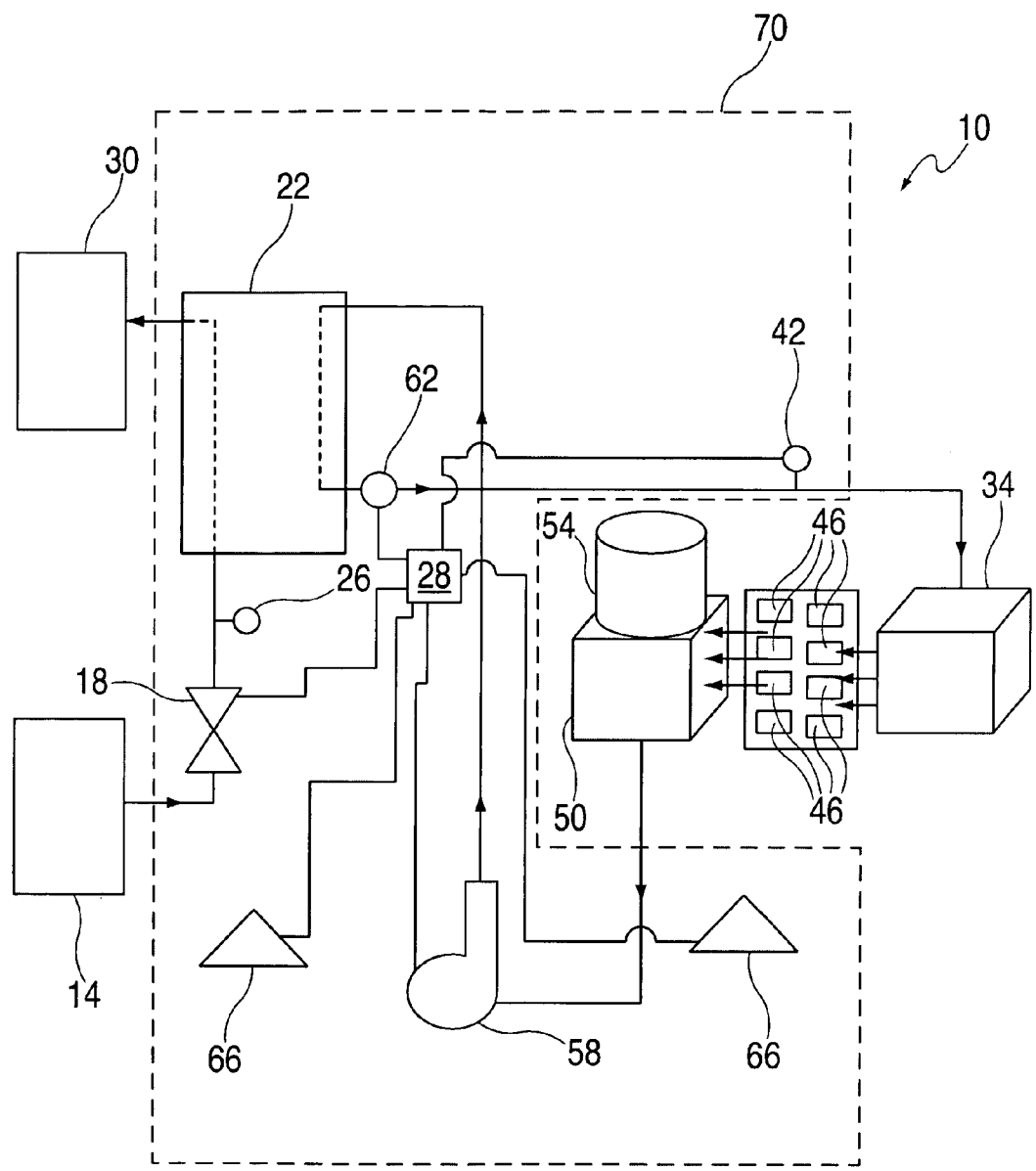
FIG. 1 is a schematic diagram of the disclosed system.

Referring to FIG. 1, a schematic diagram of an embodiment of a disclosed fluid cooling system 10 is shown. A first valve 18 is in fluid communication with a fluid supply 14 and in fluid communication with a heat exchanger 22. The first valve 18 may be any valve suitable to control the flow of a fluid through a flowpath of the heat exchanger 22. The first valve 18 may comprise a proportional valve and electronic actuator. One commercially available proportional valve and actuator is made available by Johnson Controls, Milwaukee, Wis. (Part Number: VG7241GT+7125G). Of course other suitable proportional valves and actuators may be used. The fluid may be any suitable fluid that can be used in a heat exchanger. Some considerations for selecting a proper fluid are: heat absorption properties, heat dissipation properties, corrosion considerations, and leak effect considerations. In one embodiment, the fluid is chilled water. The temperature of the chilled water should be such that it will provide enough heat transfer for heated water coming from the heat sources, e.g. electronic components. In one embodiment, the proper heat transfer will occur if the temperature of the chilled water is between about 4 degrees Celsius and about 16 degrees Celsius. The fluid cooling system 10 comprises a first temperature sensor 26 configured to measure the temperature of the fluid between first valve 18 and the heat exchanger 22. The temperature sensor may be selected from any of a number of temperature sensors suitable to measure a fluid used between the first valve 18 and heat exchanger 22.

Still referring to FIG. 1, the heat exchanger is also in fluid communication with a fluid return 30. The fluid cooling system 10 is configured such that a proper pressure differential between the fluid supply 14 and fluid return 30 will provide enough pressure to sustain the flow of the fluid from the fluid supply 14 through the valve 18 and a path of the heat exchanger 22 back to the fluid return 30. In one embodiment, enough pressure to sustain a flow of fluid will be available if the fluid supply has a pressure difference between supply side and return side ranging from about 1 pounds per square inch (PSI) to about 30 PSI. In another embodiment, enough pressure to sustain a flow of fluid will be available if the pressure difference between supply side and return side ranges from about 3 PSI to about 15 PSI. The heat exchanger 22 is also in fluid communication with a cold plate supply manifold 34. Measuring the pressure in the fluid flow between the heat exchanger 22 and cold plate supply manifold 34 is a pressure sensor 62. The heat exchanger 22 may be any suitable heat exchanger that can be used to cool cold plates used to transfer heat from heat sources. In one embodiment, the heat exchanger 22 is an ITT Standard, Cheektowaga, N.Y., Brazepak model BP410-40. The heat exchanger 22 may be sized to handle heat loads up to about 20 kilowatt (kW) at about 20 gallons per minute (GPM). The heat exchanger 22, may be a liquid heat exchanger, that is the fluids used to transfer heat within the heat exchanger 22 are liquid. Of course, the heat exchanger may be sized differently according to design specifications based on the cooling needs of the heat sources. A second temperature sensor 42 is configured to measure the temperature of the fluid between the heat exchanger 22 and the cold plate supply manifold 34. In one embodiment the first and second temperature sensors 26, 42 may be Omega, Stamford, Conn., resistance temperature detector (RTD) plug probe sensors with National Pipe Tapered Thread (NPT) fittings.

The cold plate supply manifold 34 is in fluid communication with one or more cold plates 46. The one or more cold plates 46 are also in fluid communication with a cold plate return manifold 50. The cold plate return manifold 50 may be in fluid communication with an optional reservoir 54. The cold plate supply manifold 34 supplies fluid to the cold plates 46. The fluid leaves the cold plates 46 and enters the cold plate return manifold 50. The cold plates are located adjacent to one or more heat sources throughout the computer system. The manifolds 34, 50 can be configured for numerous different flow paths to circulate across numerous cold plates 46.

The cold plate return manifold 50 is in fluid communication with a pump 58. The optional reservoir 54 is configured to provide enough pressure head and volume to prevent the pump 58 from cavitating. Of course, in some embodiments the manifold 50 may be configured to provide enough pressure head and volume to obviate the need for a reservoir 54. The pump 58 is also in fluid communication with the heat exchanger 22.

A controller 28 is a device that is configured to run a control algorithm which controls, based upon signals the controller 28 receives, the operation of the first valve 18, and the operation of the pump 58 to satisfy the cooling requirements of the heat sources located throughout the computer and/or electronic system. Such signals include, but are not limited to signals received from the temperature sensors 26, 42, signals from the pressure sensor 62, signals from the leak detectors 66, and signals from a reservoir sensor. Therefore, the controller 28 is in operable communication with one or more the following non-exhaustive list of components: the first valve 18; the first temperature sensor; the second temperature sensor; the pump 58; and one or more leak detectors 66 located within the system 10. Additionally the controller may be configurable to provide an alarm when certain values exceed or fall below programmed set points and/or if one or more of the leak detectors 66 detect a leak. In one embodiment, the controller 28 may be an MDA-RM card supplied by IBM, Poughkeepsie, N.Y.

The fluid used on the cold plate side of the fluid cooling system 10 may be any fluid suitable for cooling the cold plates 46 and transferring heat in the heat exchanger 22. Such a fluid may include, but need not be limited to: water, propylene glycol, ethylene glycol or combinations thereof.

Several of the above recited components, discussed with respect to FIG. 1, comprise a modular fluid unit 70. The modular fluid unit comprises: the first valve 18; the heat exchanger 22; the first temperature sensor 26; the second temperature sensor 42; the pump 58 and the controller 28. Additionally, one or more leak detectors 66 will be located within the modular fluid unit 74 and be in operable communication with the controller 28.

Figure 2:
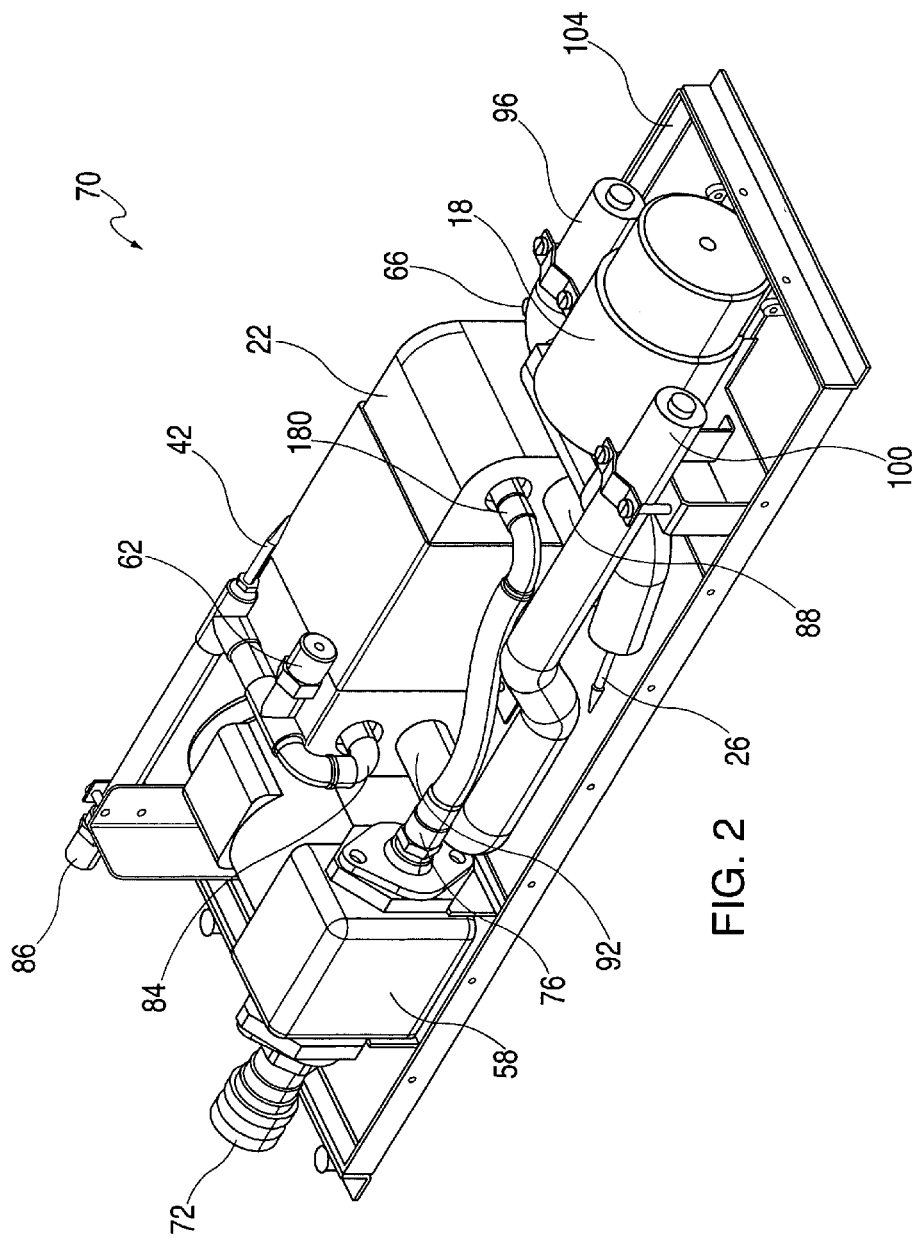
FIG. 2 is a perspective view of the disclosed apparatus.

As shown in FIG. 2, the modular fluid unit may be configured to fit in a support structure for equipment needing cooling, such as a rack. FIG. 2 shows a perspective view of an embodiment of a modular fluid unit 70. A pump inlet 72 and a pump outlet 76 are shown in fluid communication with the pump 58. The pump inlet 72 is also in fluid communication with a cold plate return manifold 50 (not shown in this view, refer back to FIG. 1). The pump outlet 76 is in fluid communication with a heat exchanger first inlet 80, which in turn is in fluid communication with the heat exchanger 22. The heat exchanger 22 is also in fluid communication with a heat exchanger first outlet 84, a heat exchanger second inlet 88 and a heat exchanger second outlet 92. The heat exchanger first outlet 84 is in fluid communication with a cold plate supply outlet 86, which in turn is in fluid communication with the cold plate supply manifold 34 (not shown). The pressure sensor 62 is configured to measure the pressure between the heat exchanger first outlet 84 and the cold plate supply manifold 34. In one embodiment, the pressure sensor 62 may be a pressure switch that is triggered if a loss of pressure is detected, e.g. when the pressure falls below 10 psi, the pressure switch will indicate a problem. There is also a second temperature sensor 42 configured to measure the temperature between the heat exchanger first outlet 84 and the cold plate supply manifold 34. The fluid supply 14 (not shown) is in fluid communication a fluid supply inlet 96. The fluid supply inlet is in fluid communication with the first valve 18. The first valve 18 is in fluid communication with the heat exchanger second inlet 88. The first temperature sensor 26 is configured to measure the temperature between the first valve 18 and the heat exchanger second inlet 88. The heat exchanger second outlet 92 is in fluid communication with a fluid return outlet 100. The modular fluid unit 70 also comprises a drip pan 104, which is configured to retain any liquid condensate or liquid that may leak from other components in the modular fluid unit 70. One leak detector 66 is shown partially obstructed by the fluid return outlet 100. Another leak detector may be located near the pump 58 (not shown in this view) or wherever a leak detector is desired. A leak detector is employed to enhance probability that a leak is detected early. It will be understood, however, that a single leak detector can be used and may be placed in a low spot of the drip pan 104. The modular fluid unit 70 can be configured to be mountable at any storage rack, and in one embodiment is sized to be mountable in a 22 inch by 32 inch rack that has four rack units (U) (each rack unit is 1.75 inches) of height. The pump inlet 72, cold plate supply outlet 86, fluid supply inlet 96 and fluid return outlet 100 may all comprise quick connect couplings for fast coupling and de-coupling with little or no leaking of the fluid.

Figure 3:
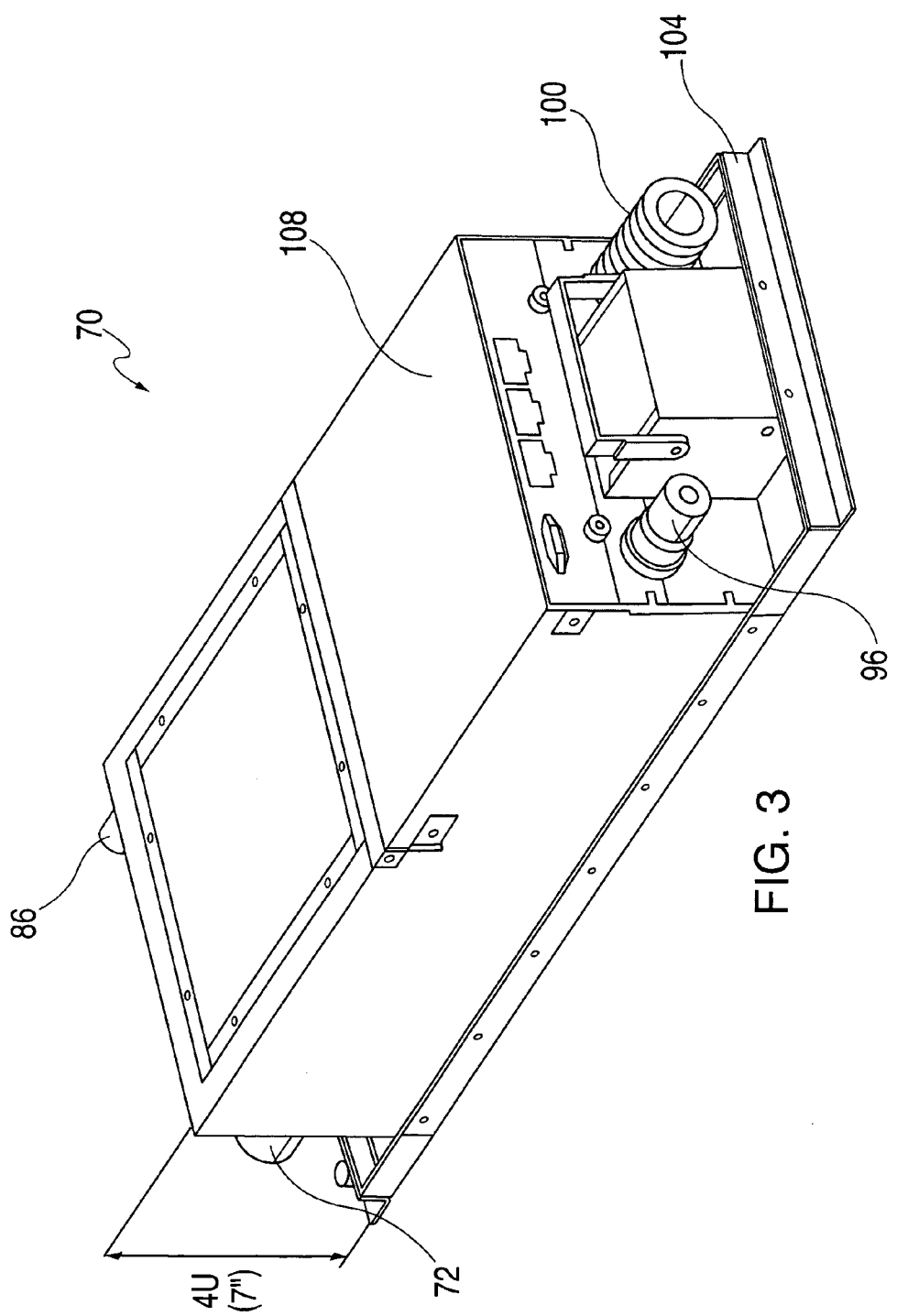

FIG. 3 shows a perspective view of the modular fluid unit 70 with a cover 108 over most of the components. The drip pan 104 and cover 108 may be fabricated from sheet metal or other material capable of performing the duties of each of these components, specifically supporting the other components of the unit 70, providing a cover to the other components of the unit 70, providing noise and vibration reduction and containing leaks to some degree.

Figure 4:
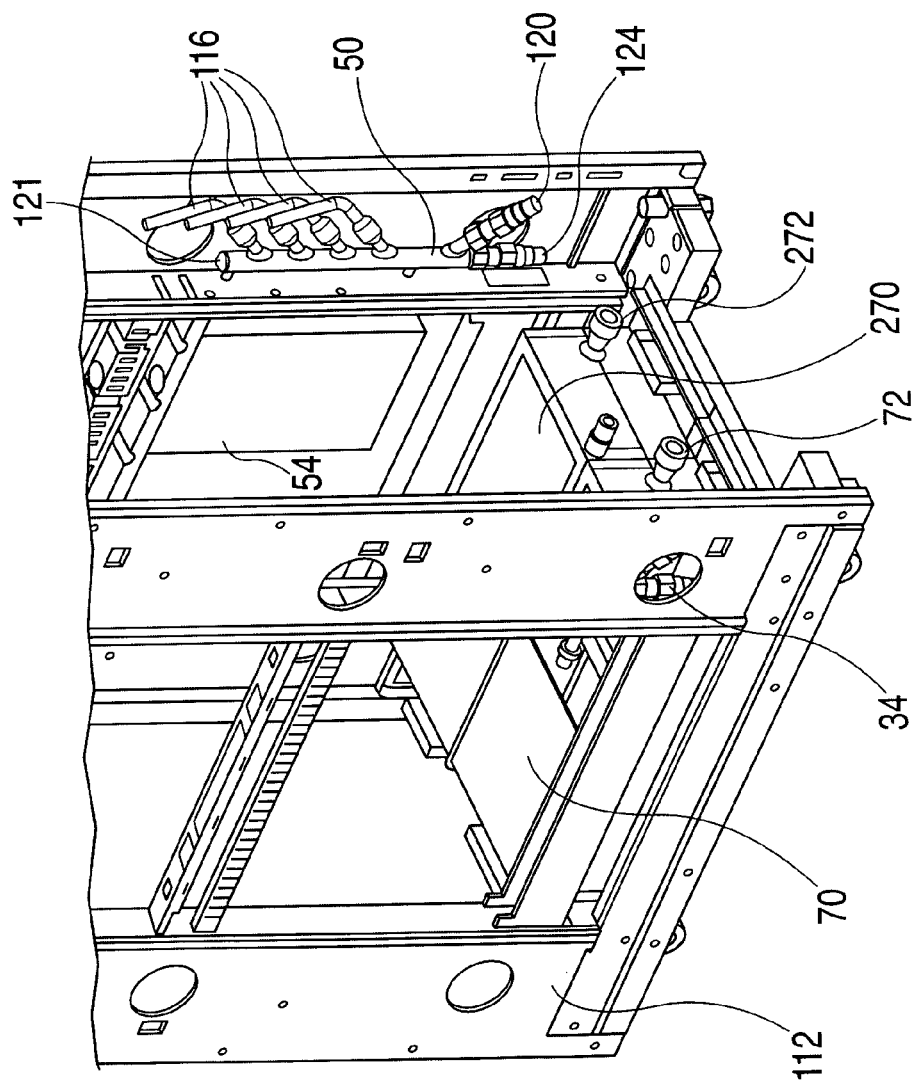
FIG. 4 is a perspective view of the system and rack.

FIG. 4 shows a perspective view of a rack 112 with a first modular fluid unit 70, and a redundant modular fluid unit 270, both located at the bottom of the rack 112. Having a redundant modular fluid unit 270 allows for passive and/or active control switching so that either one of the two modular fluid units 70, 270 can be removed and serviced while the other modular fluid unit keeps the cooling system operating. For clarity, the rack 112 is shown without any computer components, electronic components, or cold plates installed. The cold plate return manifold 50 is shown attached to the rack 112. A portion of the cold plate supply manifold 34 can be seen through an opening in the rack 112. The cold plate return manifold is in fluid communication with the reservoir 54. In fluid communication with the cold plate return manifold 50 is one or more cold plate return connectors 116. Each of the cold plate return connectors are in fluid communication with one or more cold plates 46 (not shown). There are two outlets 120, 124 from the cold plate return manifold 50, a first outlet 120 and a second outlet 124. Each of the outlets are in fluid communication (not shown) with one of the modular fluid units 70, 270. For instance, the first outlet 120 may be in fluid communication (not shown) with the pump inlet 72 of the modular fluid unit 70, and the second outlet 124 may be in fluid communication (not shown) with the pump inlet 272 of the other modular fluid unit 270. The cold plate return manifold 50 also has a capped end 121. The cap may be removed and fluid may be added at the capped end 121.

Figure 5:
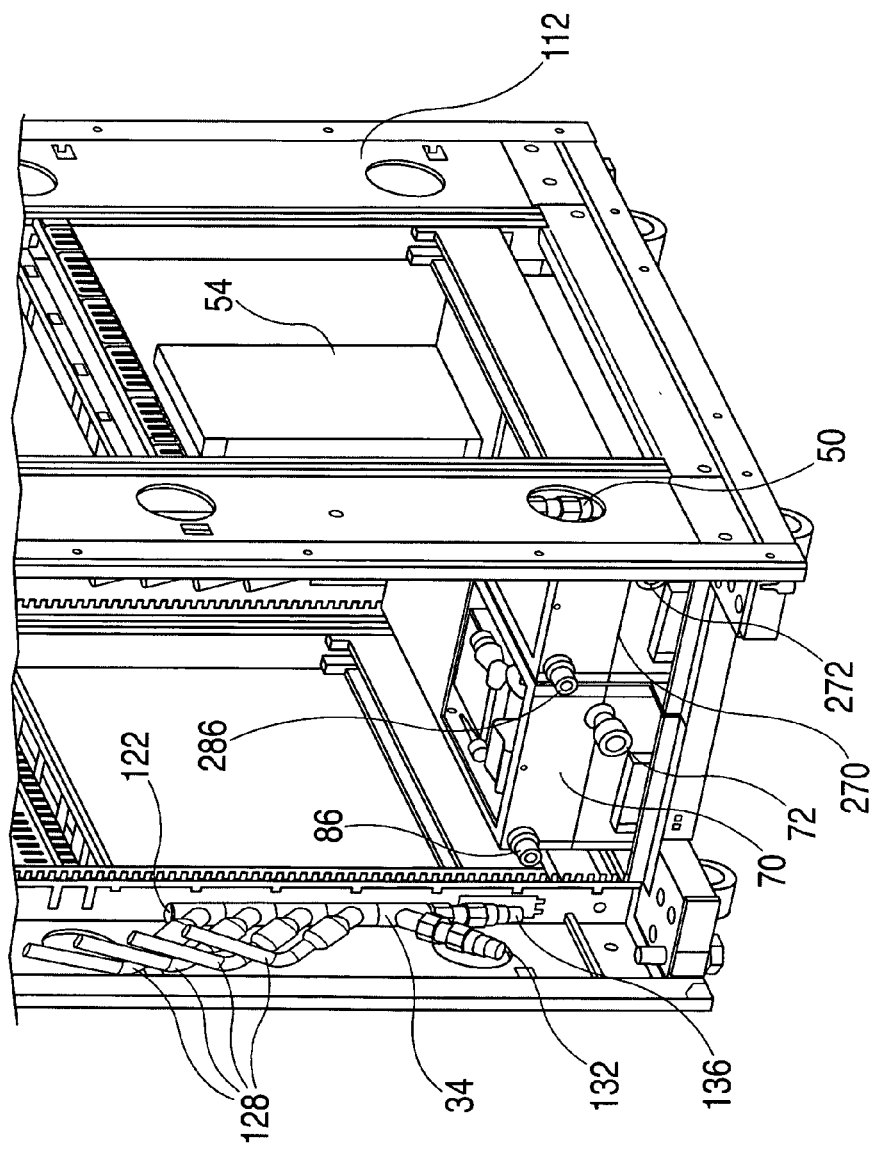
FIG. 5 is another perspective view of the system and rack from FIG. 4.

FIG. 5 shows a view of the rack 112 where the cold plate supply manifold 34 is plainly visible. Although mostly obstructed, a portion of the cold plate return manifold 50 can be seen through an opening in the rack 112. The cold plate supply manifold 34 is shown attached to the rack 112. In fluid communication with the cold plate supply manifold 34 is one or more cold plate supply connectors 128. Each of the cold plate supply connectors is in fluid communication with one or more cold plates 46 (not shown). There are two inlets 132, 136 from the cold plate supply manifold 34, a first outlet 132 and a second outlet 136. Each of the inlets 132, 136 are in fluid communication (not shown) with one of the modular fluid units 70, 270. For instance, the first outlet 132 may be in fluid communication (not shown) with the cold plate supply outlet 86, and the second outlet 136 may be in fluid communication (not shown) with a cold plate supply outlet 286 of the modular fluid unit 270. Quick connect couplings on the manifolds 34, 50 permit convenient attachment/detachment of rack hoses without loss of liquid. The cold plate supply manifold 34 also has a capped end 122. The cap may be removed and fluid may be added at the capped end 122.

In one embodiment, the modular fluid unit can be stacked in a rack separate from other racks which have components that need to be cooled. The modular fluid unit can then supply cooling water to the other racks.

In another embodiment, the modular fluid unit can be used to supply cooling water to an air fin and tube heat exchangers, which can be used to cool the air within an electronics rack, instead of using a cold plate.

The disclosed modular fluid control units are mounted within a rack, as opposed to being a stand alone unit, occupying floor space. Since the modular fluid control units are installed in the rack, the modular fluid control units can be used in any layout regardless of what type of raised floor, if any, the racks are located on. Since the modular fluid control units are modular, they can be quickly removed and installed into racks, thus limiting machine downtime. Additionally, since two fluid control units can be used in one rack, it is possible to run these units redundantly. In such a configuration, one of the two fluid control units can be serviced without having to shut down the computer system. The modular fluid control units can be configured to weigh less than about 75 pounds, thereby qualifying the modular fluid control units for only a two man lift.

Figure 6:
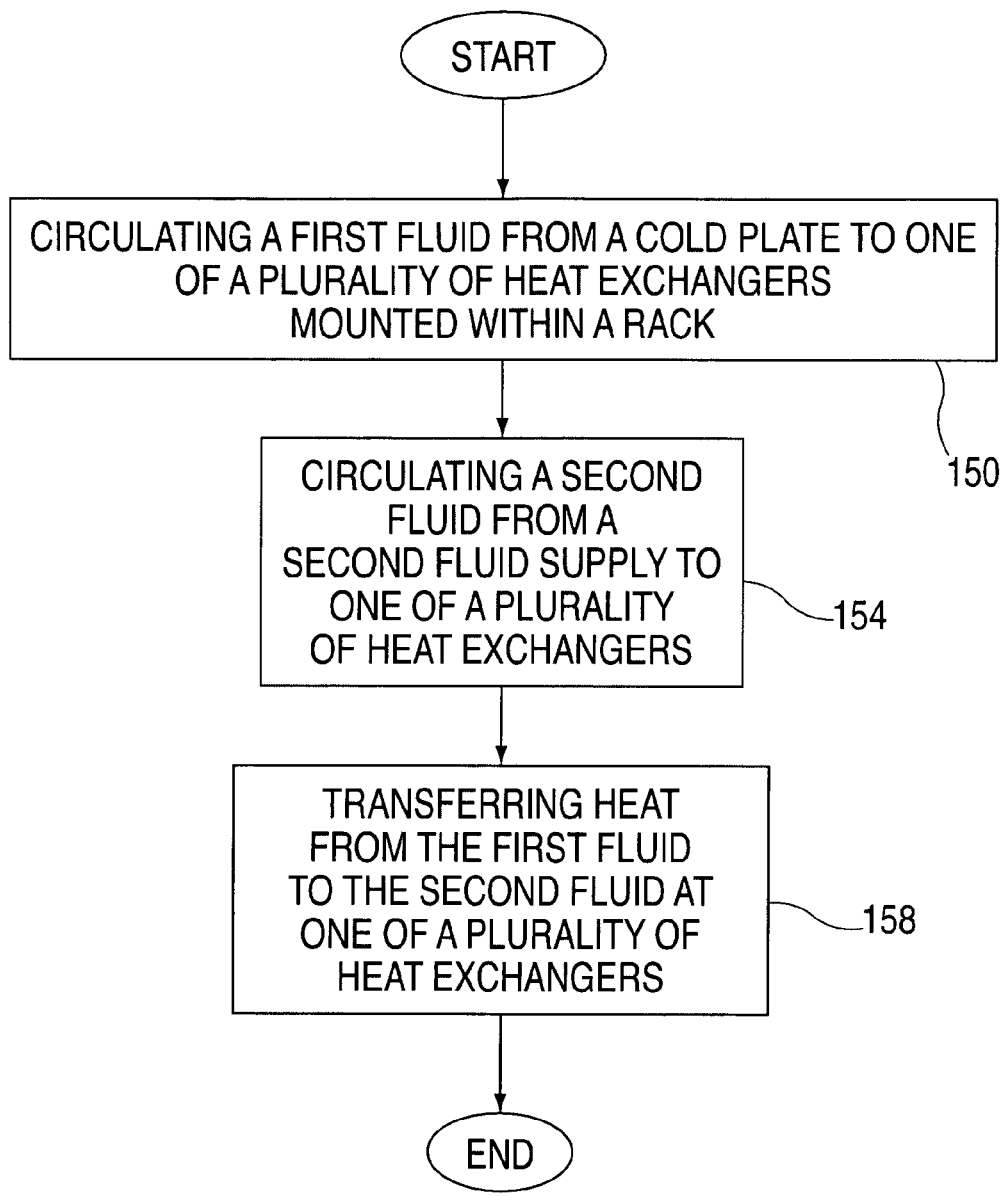
FIG. 6 is flowchart illustrating one embodiment of the disclosed method.

Although it will be apparent to one of ordinary skill in the art from the foregoing, it is pointed out that from a high level perspective, the method disclosed may be illustrated in the embodiment of the method shown in FIG. 6. At process block 150, a first fluid is circulated from a cold plate to one of a plurality of heat exchangers. At process block 154, a second fluid is circulated from a second fluid supply to a one of a plurality of heat exchangers. At process block 158, heat is transferred from the first fluid to the second fluid at one of the plurality of heat exchangers.

The use of the terms first, second, etc. do not denote any order or importance, but rather the terms first, second, etc. are used to distinguish one element from another.

While the disclosed apparatus and method has been described with reference to a preferred embodiment, it will be understood by those skilled in the art that various changes may be made and equivalents may be substituted for elements thereof without departing from the scope of the disclosed apparatus and method. In addition, many modifications may be made to adapt a particular situation or material to the teachings of the disclosed apparatus and method without departing from the essential scope thereof. Therefore, it is intended that the disclosed apparatus and method not be limited to the particular embodiment disclosed as the best mode contemplated for carrying out this disclosed apparatus and method, but that the disclosed apparatus and method will include all embodiments falling within the scope of the appended claims.

What is claimed is:

1. A modular fluid unit for cooling heat sources located on a rack, the modular fluid unit comprising:
 a heat exchanger in fluid communication with a pump and a first valve; and said modular fluid unit mountable within the rack and configurable to be in fluid communication with a cold plate return manifold, a cold plate supply manifold, and a fluid supply;

a first temperature sensor configured to measure the temperature of a fluid flowing between the first valve and the heat exchanger;

a second temperature sensor configured to measure the temperature of a fluid flowing between the heat exchanger and the cold plate supply manifold; and a pressure sensor configured to measure the pressure of the fluid flowing between the heat exchanger and the cold plate supply manifold.

2. The modular fluid unit of claim 1, wherein the heat exchanger is a liquid heat exchanger.

3. The modular fluid unit of claim 1 further comprising a drip pan configured to retain a liquid.

4. The modular fluid unit of claim 3 further comprising a sheet metal housing in operable communication with the drip pan and configured to enclose the pump, the heat exchanger and the first valve.

5. The modular fluid unit of claim 1, configured to weigh less than about 75 pounds.

6. The modular fluid unit of claim 1, where the pump comprises a quick release inlet, and the heat exchanger comprises a quick connect fluid supply inlet and a quick connect cold plate supply outlet, and the first valve is in communication with a quick connect fluid return outlet.

7. The modular fluid unit of claim 1, wherein the modular unit is mountable in a rack that is about 22 inches wide by about 32 inches deep and about 4 rack units high.

8. The modular fluid unit of claim 1, further comprising:
a controller in operable communication with the first temperature sensor, second temperature sensor, pressure sensor, pump and first valve.

9. The modular fluid unit of claim 1, wherein the pressure sensor is a pressure switch.

10. A system for cooling heat sources, the system comprising:
a rack for holding electronic components;
a cold plate located adjacent to a heat source located on the electronic components;
a cold plate supply manifold in fluid communication with the cold plate;
a cold plate return manifold in fluid communication with the cold plate;
a modular fluid unit mounted within the rack in fluid communication with the cold plate supply manifold, the cold plate return manifold and a fluid supply, said modular fluid unit further comprising:
a heat exchanger in fluid communication with a pump and a first valve;
a first temperature sensor configured to measure the temperature of a fluid flowing between the first valve and the heat exchanger;
a second temperature sensor configured to measure the temperature of a fluid flowing between the heat exchanger and the cold plate supply manifold; and
a pressure sensor configured to measure the pressure of the fluid flowing between the heat exchanger and the cold plate supply manifold.

11. The system of claim 10, further comprising a plurality of modular fluid units mounted in a side by side configuration within the rack.

12. The system of claim 10, wherein:
the heat exchanger is in fluid communication with the fluid supply and the cold plate supply manifold; wherein the pump is in fluid communication with the cold plate return manifold, and wherein the first valve is in fluid communication with the fluid supply.

13. The system of claim 12, wherein the modular fluid unit further comprises a drip pan configured to retain a liquid.

14. The system of claim 13, wherein the modular fluid unit further comprises:
a sheet metal housing in operable communication with the drip pan and configured to enclose the pump, the heat exchanger and the first valve.

15. The system of claim 13, wherein the heat exchanger is a liquid heat exchanger.

16. The system of claim 12, wherein the modular fluid unit is configured to weigh less than about 75 pounds.

17. The system of claim 12, wherein a plurality of the modular fluid units are mountable in a side by side configuration within the rack.

18. The system of claim 12, wherein the rack is about 22 inches wide by about 32 inches deep and the modular fluid unit is less than about 4 rack units high.

* * * * *